(12) United States Patent  
Montanini et al.

(10) Patent No.: US 7,629,645 B2
(45) Date of Patent: Dec. 8, 2009

(54) FOLDED-GATE MOS TRANSISTOR (75) Inventors: Pietro Montanini, Milan (IT); Marco Annese, Vignate (IT); Lucia Zullino, Milan (IT)

(73) Assignee: STMicroelectronics, S.r.l., Agrate Brianza (IT)

( * ) Notice: Subject to any disclaimer, the term of this patent is extended or adjusted under 35 U.S.C. 154(b) by 356 days.

(21) Appl. No.: 11/482,531

(22) Filed: Jul. 6, 2006

(65) Prior Publication Data  
US 2007/0034895 A1 Feb. 15, 2007

(30) Foreign Application Priority Data  
Jul. 6, 2005 (EP) .................. 05106115

(51) Int. Cl.  
*H01L 29/78* (2006.01)

(52) U.S. Cl. ............... 257/330; 257/E29.257

(58) Field of Classification Search .......... 257/330, 257/332–333, E29.257, E29.26  
See application file for complete search history.

(56) References Cited  
U.S. PATENT DOCUMENTS

| | | | |
|---|---|---|---|
| 4,243,997 A | 1/1981 | Natori et al. | |
| 4,455,740 A | 6/1984 | Iwai | |
| 5,108,937 A | 4/1992 | Tsai et al. | |
| 5,124,764 A | 6/1992 | Mori | |
| 5,364,810 A | 11/1994 | Kosa et al. | |
| 5,371,024 A * | 12/1994 | Hieda et al. ............... | 438/291 |
| 6,084,269 A | 7/2000 | Davies et al. | |
| 6,586,800 B2 | 7/2003 | Brown | |
| 6,750,511 B2 * | 6/2004 | Kawano et al. ............ | 257/332 |
| 7,400,013 B1 * | 7/2008 | Ariyoshi .................... | 257/330 |
| 2005/0020086 A1 | 1/2005 | Kim et al. | |

FOREIGN PATENT DOCUMENTS

| | | |
|---|---|---|
| EP | 1 326 280 A1 | 7/2003 |
| EP | 1 528 599 A2 | 5/2005 |
| WO | WO 99/43029 | 8/1999 |

OTHER PUBLICATIONS

European Search Report for EP 05 10 6115 dated Nov. 28, 2005.

* cited by examiner

*Primary Examiner*—Jerome Jackson, Jr.  
*Assistant Examiner*—Paul A Budd  
(74) *Attorney, Agent, or Firm*—Kevin D. Jablonski; Graybeal Jackson LLP (57) ABSTRACT

An insulated-gate transistor includes a semiconductor layer of a first conductivity type, an insulated gate comprising a trench gate extending into the semiconductor layer, a source and a drain regions of a second conductivity type formed in the semiconductor layer at respective sides of the trench gate, wherein each one of the source and drain regions includes a first doped region, having a first dopant concentration, formed in the semiconductor layer adjacent to the trench gate, said first dopant concentration being such that a breakdown voltage of the junction formed by the first doped region and the semiconductor layer is higher than a predetermined breakdown voltage, and a second doped region, having a second dopant concentration higher than the first dopant concentration, said second doped region being formed in the first doped region and being spaced apart from the trench gate, the second dopant concentration being adapted to form a non-rectifying contact for electrically contacting the first doped region.

21 Claims, 4 Drawing Sheets

FOLDED-GATE MOS TRANSISTOR

PRIORITY CLAIM

This application claims priority from European patent application No. EP05106115.8, filed Jul. 6, 2005, which is incorporated herein by reference.

TECHNICAL FIELD

An embodiment of the present invention generally relates to semiconductor devices, particularly to field effect transistors, and to methods for manufacturing such devices.

In particular, an embodiment of the invention relates to Metal-Oxide-Semiconductor (MOS) transistors and to methods for the manufacturing thereof.

More specifically, an embodiment of the invention relates to improvements to folded-gate MOS transistors, and to their methods of manufacturing.

BACKGROUND

The past approaches described in the following could be pursued, but are not necessarily approaches that have been previously conceived or pursued. Therefore, unless otherwise indicated herein, the approaches described in the following are not to be considered prior art to the claims in this application merely due to the presence of these approaches in the following background description.

In the last years, the demand of increasing the semiconductor device integration density has resulted in a reduction of the sizes of the elements used in integrated circuits.

A basic integrated circuit element is the transistor; particularly, in high-density integrated circuits, field-effect transistors are used. The use of integrated transistors in a number of relatively high-power applications, such as liquid crystal display drivers and the like, has made it necessary to manufacture small size transistors that are nevertheless able to withstand relatively high voltages (for example, 10V-70V).

Limitations in the manufacturing of small-size field-effect transistors, for example of the MOS type, often arise from the length of the transistor channel, i.e. the region between the source and drain transistor regions.

A well-defined channel length is important for the correct operation of the MOS transistor; in fact, many electrical characteristic parameters, such as the transconductance, depend on the transistor channel length.

Moreover, as the channel length becomes smaller, the correct operation of the transistor as a whole may be impaired, due for example to short-channel effects, such as punch-through phenomena or a permanently short-circuited channel.

In particular, as far as MOS transistors for relatively high-power applications (hereinafter shortly referred to as power MOS transistors) are concerned, further electrical characteristic parameters that makes the manufacturing of small-size transistors troublesome are the voltages that the power transistor should withstand at its PN junctions; in particular, in order for the MOS transistor to withstand the desired high voltages, these voltages must be lower than the breakdown voltages of the transistor PN junctions.

As known, the breakdown voltage of a PN junction depends on a certain number of design and manufacturing-process parameters, such as the dopant concentration of the regions forming the junction and the width of such regions. Particularly, the breakdown voltage is higher the lower the dopant concentration of the regions forming the junction.

Moreover, in case one or both of the regions forming the junction are lightly doped, the width of such regions should be enough to permit the desired size of the depletion area in a reverse bias condition, and this limits the possibility of reducing the integrated circuit area.

A typical MOS transistor has a semiconductor substrate region of a first conductivity type (for example, P-type) that is provided on its surface a gate oxide layer, surmounted by a gate electrode (typically, a polycrystalline silicon layer). The drain and source regions are two diffusion regions of a conductivity type opposite to the first type (for example, N-type) formed in the substrate region, and they are adjacent to the gate electrode. Moreover, two heavily doped regions are formed in the drain and source regions, respectively. These heavily doped regions are adapted to form the source and drain ohmic contacts with the subsequent metallization layers.

The channel region of the MOS transistor develops horizontally between the drain and source regions. In order for the MOS transistor to be able to withstand relatively high voltages at its PN junctions, the source and drain regions should be lightly doped regions. Moreover, the heavily doped regions adapted to form the ohmic contacts should be spaced apart a distance from the gate region. In order to decrease the MOS transistor size, the gate electrode length (i.e., the MOS transistor channel length) should be reduced, but if the channel length is reduced too much, short-channel effects may arise.

Folded-gate MOS transistors (also known in the art as vertical-gate, V-MOS, U-MOS or trench gate MOS transistors) are less affected by short channel effects. In these devices, a trench is formed in a substrate region of a first conductivity type (for example, P-type). The walls of the trench are covered with a gate oxide film, and the trench is then filled with a conductive material adapted to form the gate electrode (typically, a polycrystalline silicon layer). Source and drain regions of a conductivity type (for example, N-type) opposite to the first type are formed in the substrate region at the sides of the trench.

The folded-gate MOS transistor has a channel region developing along the vertical and bottom walls of the trench, between the source and drain regions. In such a way, even if the overall size of the folded-gate MOS transistor is reduced (for reducing the integrated circuit area), the channel region can be kept sufficiently long to prevent the short channel effects.

A U-MOS transistor is disclosed in the U.S. Pat. No. 4,455,740, which also discloses a related manufacturing method and which is incorporated by reference.

It has been observed that a folded-gate MOS transistor realized according to the teachings of U.S. Pat. No. 4,455,740 is not able to withstand high voltages across the substrate-drain and substrate-source junctions, due to the fact that the drain and source regions are heavily doped ($N^+$) diffusion layers, obtained through an ion injection of arsenic into a substrate region of an opposite conductivity type (those $N^+$ diffusion layers will be contacted by the source and drain metal contacts, thus their dopant concentration must be very high, so to form ohmic contacts). The high dopant concentration of the drain and source regions reduces the substrate-source and substrate-drain junctions breakdown voltages, and thus the voltages that can be withstood by such junctions, and this makes the transistors not particularly adapted for power applications.

U.S. Pat. No. 6,586,800, which is incorporated by reference, proposes a trench-gate MOS transistor having a trench that extends from a top surface into a channel-accommodating P-type substrate region. A gate oxide layer covers the walls of the trench, which is filled by a gate electrode. A source region consists of an N-type diffusion layer adjacent to both sides of the trench; a drain region consists of an N-type buried layer under the channel-accommodating substrate region into which the trench partly extends. The drain current is collected through a metallization layer formed under the buried layer, thus at the bottom surface of the structure.

As an alternative to the bottom surface drain contact, a top-surface sinker adapted to collect the drain current may be provided, as for example described in the U.S. Pat. No. 5,124,764, which is incorporated by reference.

In the solutions described in U.S. Pat. Nos. 6,586,800 and 5,124,764, the dopant concentration of the drain region is chosen according to the desired breakdown voltage at the drain-substrate junction.

It has been observed that in both cases, the breakdown voltages are relatively high for the substrate-drain junction, but low for the substrate-source junction. Thus, the known folded-gate power MOS transistors are inherently asymmetric, and this may be a disadvantage, because in many applications (e.g., pass transistors) the source and drain regions should be interchangeable. On the other side, the known folded-gate MOS transistors having a symmetric structure are not adapted to relatively high-power applications.

SUMMARY

In the light of the state of the art outlined above, an embodiment of the invention overcomes the drawbacks of the known MOS transistors for relatively high-power applications.

According to an embodiment of the present invention, an insulated-gate transistor has a folded-gate structure in which the drain and source regions include relatively lightly doped regions.

Moreover, a method for manufacturing a trench gate MOS transistor according to an embodiment of the present invention is proposed.

Particularly, according to an embodiment of the present invention, an insulated-gate transistor is provided. The insulated-gate transistor includes a semiconductor layer of a first conductivity type, an insulated gate comprising a trench gate extending into the semiconductor layer, source and drain regions of a second conductivity type formed in the semiconductor layer at respective sides of the trench gate. Each one of the source and drain regions includes a first doped region, having a first dopant concentration, formed in the semiconductor layer adjacent to the trench gate, said first dopant concentration being such that a breakdown voltage of the junction formed by the first doped region and the semiconductor layer is higher than a predetermined breakdown voltage, and a second doped region, having a second dopant concentration higher than the first dopant concentration, said second doped region being formed in the first doped region and being spaced apart from the trench gate, the second dopant concentration being adapted to form a non-rectifying contact for electrically contacting the first doped region.

Such an embodiment may solve the above-discussed problems associated with the manufacturing of small-size transistors.

In particular, the problems of short-channel effects may be overcome, even if the size of the transistor is reduced: in fact, by extending the depth of the trench down to a desired value, it is possible to lengthen the channel.

Moreover, choosing a suitable dopant concentration for the first doped regions allows one to realize a transistor able to withstand relatively high voltages (higher than a predetermined voltage) at its PN junctions: in fact, the dopant level of the first doped regions is a design parameter that can be adjusted depending on the desired voltage rating to be achieved, and is not determined by the necessity of forming non-rectifying contacts.

Keeping the second doped regions spaced apart from the trench gate allows reducing the stress at the gate oxide.

BRIEF DESCRIPTION OF THE DRAWINGS

Features and advantages of the present invention will be made apparent by the following detailed description of one or more embodiments thereof, provided merely by way of non-limitative example, a description that will be conducted making reference to the attached drawings.

DETAILED DESCRIPTION

In the following description, it should be noted that the figures are not drawn to scale. Relative dimensions and proportions of portions of drawings have been increased or reduced in size for sake of clarity.

Figure 1:
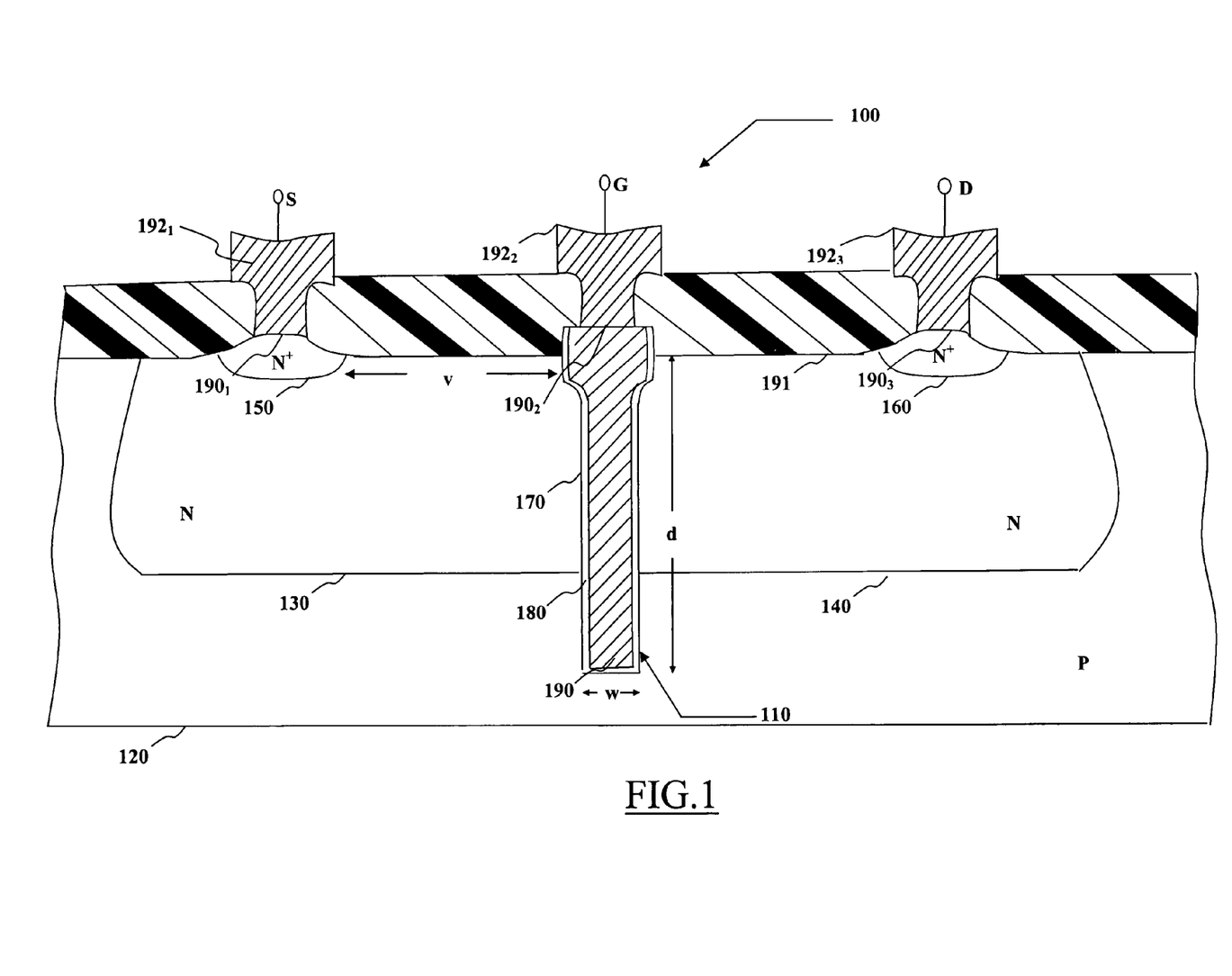
FIG. 1 is a cross-sectional view of a transistor according to an embodiment of the invention.

Referring to FIG. 1 a cross-sectional view of a folded-gate MOS transistor 100 according to an embodiment of the present invention is shown. A trench gate 110 extends into a semiconductor region 120 (which can be for example a region of an integrated circuit chip substrate, or a doped well formed therein) of a first type of conductivity (for example, P-type), to a depth d with respect to an active surface of the region 120, and has a width w. Adjacent to the sides of trench gate 110, relatively lightly doped source and drain regions 130 and 140 of a second type of conductivity, opposite to the first (for example, N-type) are formed. Two heavily doped regions 150 and 160 of the second type of conductivity (N-type in this example) are formed in the regions 130 and 140, respectively, at a distance v from the lateral walls of the trench gate 110. The trench gate 110 includes a trench 170 excavated in the semiconductor region 120, a gate oxide layer 180 and a polycrystalline silicon layer 190. The gate oxide layer 180, with a thickness significantly lower than half of the width w of the trench, covers the walls of the trench 170. The polycrystalline silicon layer 190 fills the trench 170. A field oxide layer 191 covers the surface of the substrate region 120, exception made for three contact windows $190_1$, $190_2$ and $190_3$, located over the source heavily doped region 150, the polysilicon layer 190 and the drain heavily doped region 160.

Metallizations $192_1$, $192_2$, and $192_3$ fill the windows $190_1$, $190_2$, $190_3$ and contact the source, gate and drain of the MOS transistor 100, forming the source, gate, and drain terminals S, G and D, respectively.

The MOS transistor channel region includes a portion of the semiconductor region 120 between the source and drain regions 130 and 140, developing along the vertical and bottom walls of the trench-gate 110. The MOS transistor 100 thus has a folded-gate structure, which allows achieving a relatively high channel length at the same time saving integrated circuit area. In particular, it is possible to shrink the lateral dimensions of the MOS transistor, without for this reason incurring short-channel effects, because the channel length can be increased by increasing the depth d of the trench.

The diffusion layer 130 and 140 is relatively lightly doped; for example, it has a dopant concentration ranging from approximately $1*10^{15}$ ions/cm$^3$ to approximately $1*10^{17}$ ions/cm$^3$. Thus, a breakdown voltage of the junctions between the source and drain regions 130 and 140 and the semiconductor region 120 is kept relatively high, approximately 50V, in this way the MOS transistor is capable of withstanding relatively high voltages. In particular, the dopant concentration of the source and drain regions 130 and 140 is chosen such that the junctions breakdown voltages are higher than a predetermined breakdown voltage depending on the operating voltages that the MOS transistor is designed to withstand.

The further diffusion layer 150 and 160 is heavily doped; for example, it has a dopant concentration ranging from approximately $1*10^{17}$ ions/cm$^3$ to approximately $1*10^{19}$ ions/cm$^3$. In this way, it is ensured that the contacts with the metallizations $192_1$, $192_3$ are relatively low-resistance, non-rectifying (i.e., ohmic) contacts.

Exploiting the above-described structure, one may obtain a folded-gate MOS transistor capable of sustaining voltages of about 50V, having a pitch of 3.5 μm, whereas conventional horizontal-gate structures are capable of sustaining the same voltages but having a pitch of about 11.5 μm.

Moreover, the fact that the heavily doped regions 150 and 160 are spaced apart the distance v from the trench lateral walls reduces the stress voltage at the gate oxide 180.

Referring now to FIGS. 2A through 2H, a process for the manufacturing of the transistor 100 according to an embodiment of the present invention will be explained in detail.

Figure 2A:
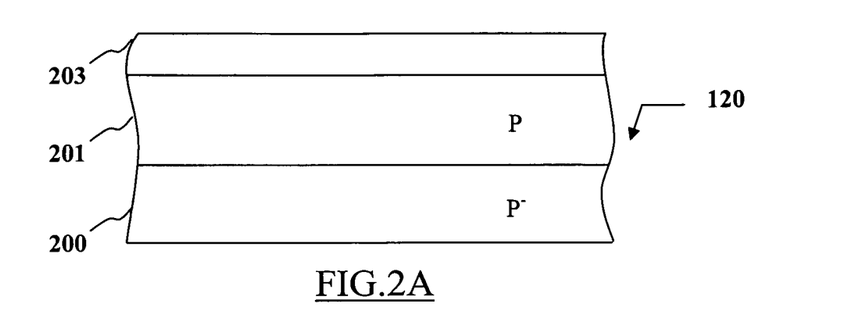
FIG. 2A through 2H are cross-sectional views illustrating some steps in the manufacturing of the transistor of FIG. 1, according to an embodiment of the invention.
Figure 2B:
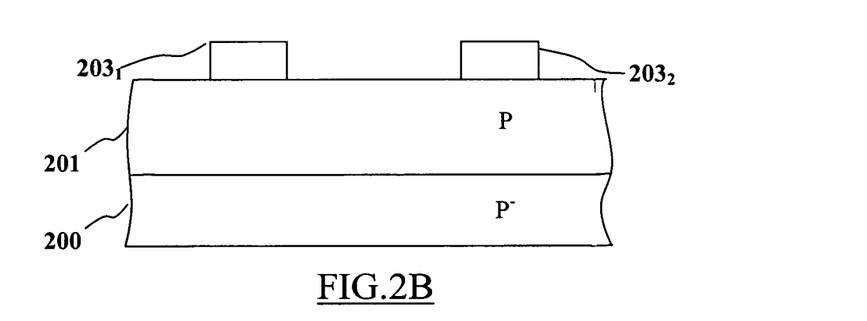

Referring to FIG. 2A, starting from a semiconductor substrate 200 (for example, the silicon wafer substrate) of a first type of conductivity (in the example at issue, P-type, with a dopant concentration of approximately from $1*10^{14}$ ions/cm$^3$ to $1*10^{15}$ ions/cm$^3$), a slightly more doped layer 201 is epitaxially grown over the substrate 200; for example, the epitaxial layer 201 may have a dopant concentration ranging from approximately $1*10^{16}$ ions/cm$^3$ to approximately $1*10^{17}$ ions/cm$^3$ and a thickness of about 7 μm. Successively, a silicon nitride film 203, with a thickness of about 100 nm, is deposited on top of the epitaxial layer 201, for example by means of a CVD (acronym for Chemical Vapor Deposition) process. Thereafter, the silicon nitride film 203 is selectively etched and removed, using a conventional photoetching process, as shown in FIG. 2B. As a result, two silicon nitride film portions $203_1$ and $203_2$ are left, covering the epitaxial layer 201.

Figure 2C:
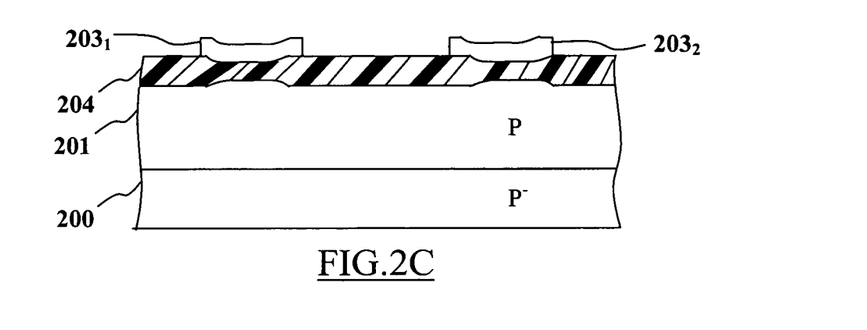

The resultant wafer is then subjected to a thermal oxidation treatment, whereby an oxide layer 204 is grown, the oxide layer being thicker where the epitaxial layer is not covered by the silicon nitride, as shown in the FIG. 2C. The oxide layer 204 forms field oxide isolation regions, which for example are obtained by means of the conventional LOCOS technique. In alternative, the oxide layer 204 may be obtained by other techniques, such as the STI (acronym for Shallow Trench Isolation) and Recessed LOCOS techniques.

Figure 2D:
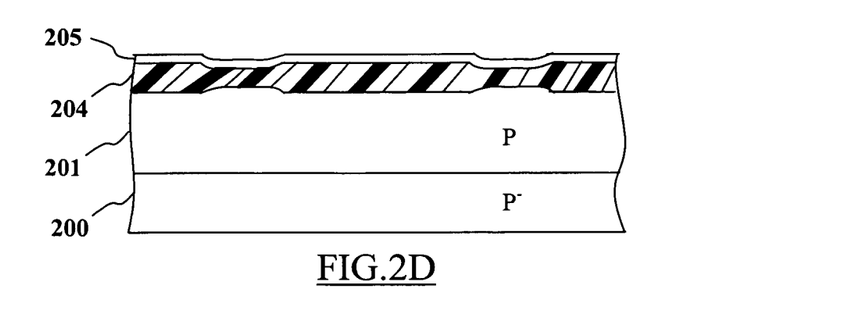

In particular, the field oxide layer 204 includes thinner and thicker portions; the thinner portions are approximately under the silicon nitride film portions $203_1$ and $203_2$. After the removal of the nitride film portions $203_1$ and $203_2$, a further silicon nitride film 205 is formed over the structure surface, e.g. by a CVD process, as shown in FIG. 2D.

An oxide layer 206 is then formed (e.g., deposited) on top of the silicon nitride film 205.

Figure 2E:
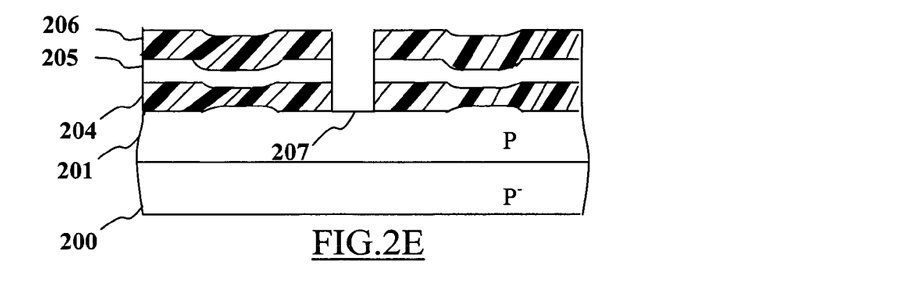

A first trench portion 207 is then formed, selectively etching the layers 204, 205 and 206, as shown in FIG. 2E. To form the first trench portion 207, a hard mask (not shown in figure) is provided on the oxide layer 206, the hard mask leaves exposed an area of the layer 206 where the first trench portion 207 is to be formed.

Figure 2F:
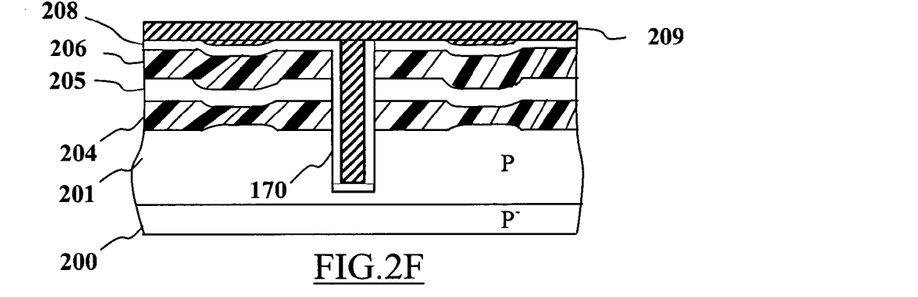

Using suitable etching techniques, the layers 206, 205 and 204 are selectively removed, down to the surface of the epitaxial layer 201. Thereafter, a portion of epitaxial layer 201 is selectively etched, with the layers 204, 205 and 206 used as a mask. The resultant trench 170 has, for example, a depth ranging from approximately 2 μm to approximately 8 μm. Then, a thermal oxidation is performed to grow a gate oxide film 208, having a thickness of about 1300 Å, covering the entire surface the wafer, including the lateral and bottom walls of the trench 170. A polycrystalline silicon layer 209 is formed by the CVD process over the wafer structure surface, at the same time filling the trench 170, as shown in FIG. 2F.

Figure 2G:
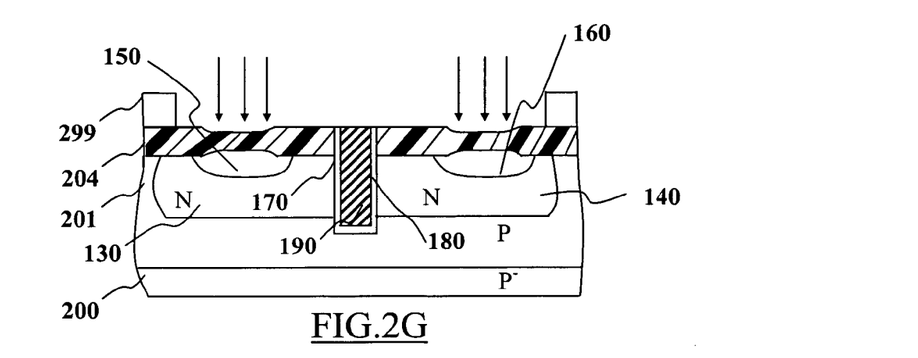

Thereafter, the layers 209, 208, 206 and 205 are removed down to the surface of the field oxide layer 204. As depicted in FIG. 2G, an implant mask 299 is formed on the oxide layer 204 and it is used for the subsequent dopant implantation processes.

A first dopant implantation process is performed, for forming the MOS transistor source and drain regions 130 and 140; for example, in order to form N-type source and drain regions, arsenic or phosphorus dopant ions may be used.

Particularly, the first implantation process is performed at a relatively high energy, for example up to 2 to 3 MeV, in order to cause the dopant ions penetrate the field oxide layer 204 and the epitaxial layer 201, down to a desired depth, whereas where the mask 299 is present the dopants do not reach the surface of the epitaxial layer 201. The implanted dopants form the source and drain regions 130 and 140 of conductivity type opposite to the first of the transistor 100.

The dopants, after having been implanted, may be simply activated by means of a low thermal budget Rapid Thermal Process (RTP), without being made to diffuse into the epitaxial layer.

Preferably, the dopant concentration of the source and drain regions 130 and 140 ranges from approximately $1*10^{15}$ ions/cm$^3$ to approximately $1*10^{17}$ ions/cm$^3$, and the depth of these regions with respect to the surface of the epitaxial layer 201 ranges from approximately 2.5 μm to approximately 3 μm.

The implantation dopant dose, and thus the final dopant concentration of the source and drain regions 130 and 140, is chosen such that the junctions breakdown voltages of the MOS transistor are higher than the predetermined breakdown voltage, depending on the operating voltages that the MOS transistor is designed to withstand.

Alternatively, the source and drain regions may be graded doped junctions. In this case it is possible to perform more than one dopant implantation processes, at different, relatively high energies, for example 200 keV, 300 KeV, 1000 keV and 2500 keV.

Successively, still using the mask 299, a second dopant implantation process is performed in order to form two heavily doped regions 150 and 160 of the second type of conductivity (in the example at issue, N-type), used for the subsequent realization of ohmic contacts to the source and drain regions 130 and 140. In particular, the second dopant implantation process is performed at an energy sufficiently high to cause the dopants penetrate the thinner portions of the field oxide layer 204, but too low to cause the dopants penetrate the thicker portions of the field oxide layer 204. For example, arsenic ions are implanted at an energy of approximately 50 KeV, adapted to concentrate the dopant distribution close to the surface of the wafer, in a dose sufficiently high to obtain a dopant concentration ranging approximately from $1*10^{17}$ ions/cm$^3$ to $1*10^{19}$ ions/cm$^3$.

Figure 2H:
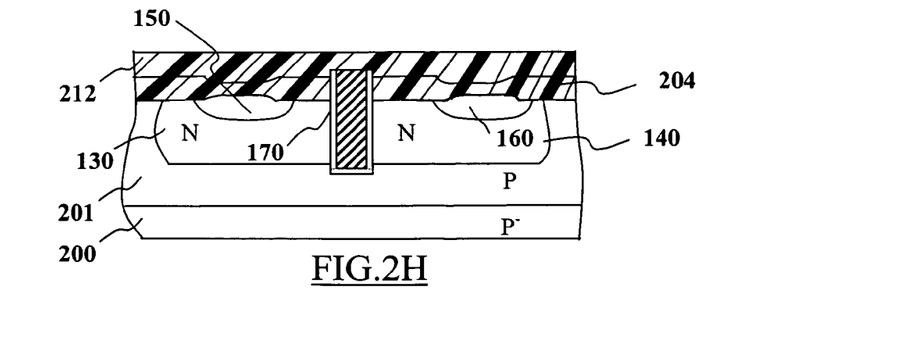

Thereafter, a silicon oxide layer 212 is grown over the silicon oxide layer 204, through an oxidation treatment. For realizing the drain, source and gate contacts, contact windows are etched through the oxide layers 212 and 204, down to the surface of the regions 150 and 160.

Afterwards, a metallization layer (e.g. aluminum) is deposited on the oxide layer 212, and the source, drain and gate contacts are formed by patterning thereof, as shown in the FIG. 1.

Figure 3A:
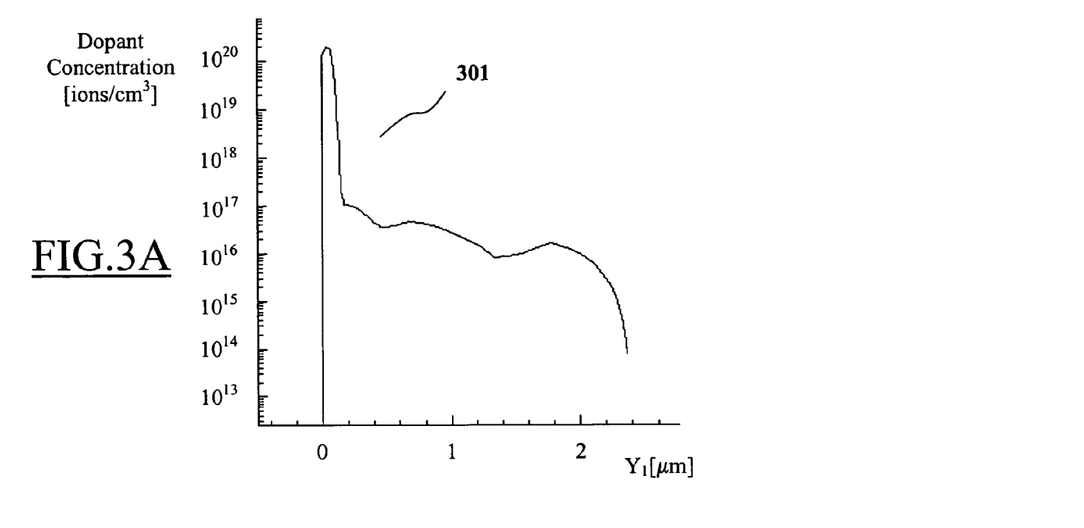
FIGS. 3A-3C show exemplificative dopant concentration profiles through the drain and source regions of the transistor of FIG. 1, according to an embodiment of the invention.
Figure 3B:
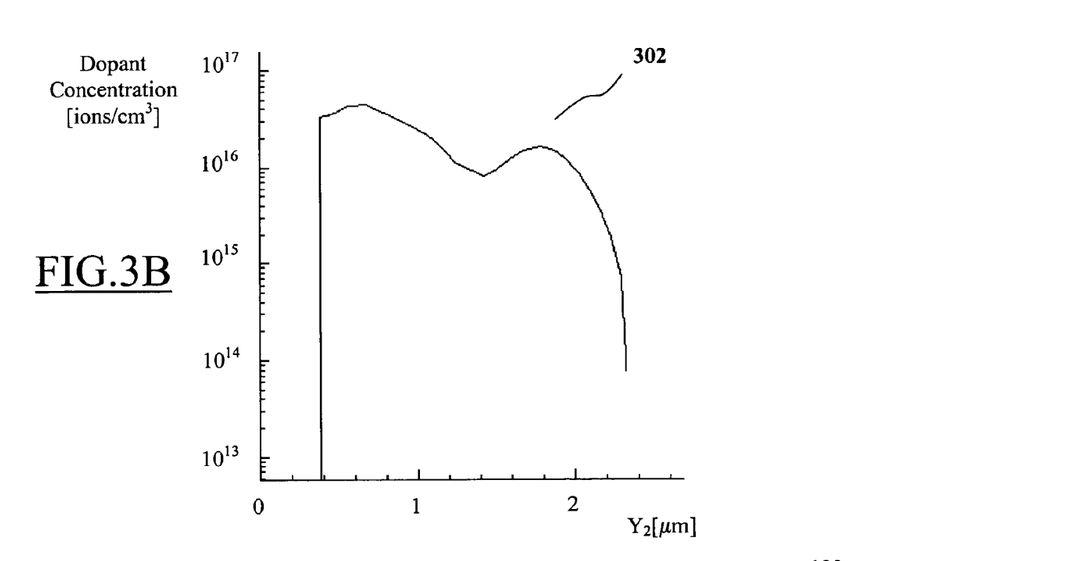
Figure 3C:
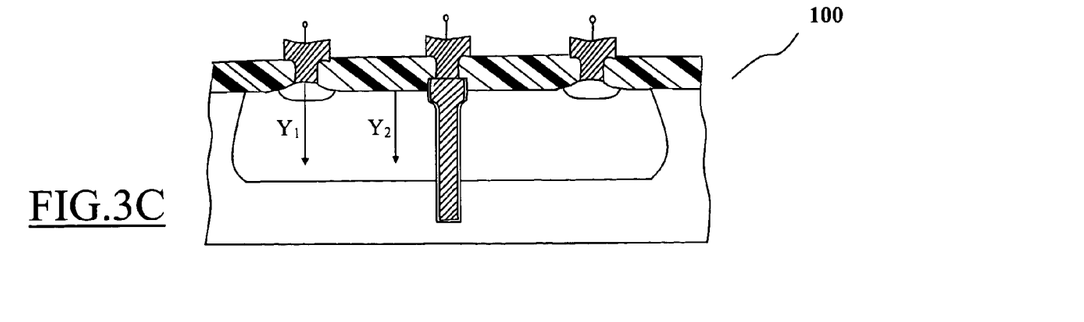

In FIGS. 3A-3C, exemplary profiles 301 and 302 of the dopant concentrations of the region of the second conductivity type (in the example at issue, N-type) along the axis $Y_1$ and $Y_2$ of the transistor 100 are shown, respectively.

In particular, the profile 301 shows the dopant concentration of the region under the ohmic contact, while the profile 302 shows the dopant concentration of the regions under the field oxide layer.

Both the profiles may be chosen in order to optimize a number of transistor parameters, such as the current capability, the on-resistance, the safe operating area (SOA) and the breakdown voltages.

In particular, referring to the profile 301, the dopant concentration of the region closer to the surface of the structure is higher than that in the deeper regions. This allows realizing the ohmic contacts of the transistor 100. Moreover, the lower dopant concentration of the deeper regions allows an increase in the breakdown voltages of the transistor.

Moving now to the profile 302, in this embodiment the dopant concentration of the regions under the field oxide layer is at least three orders of magnitude lower than the dopant concentration closer the surface of the structure. Also this choice allows increasing the breakdown voltage.

Naturally, in order to satisfy local and specific requirements, a person skilled in the art may apply to the solution described above many modifications and alterations.

Although in the preceding description reference has been made to an N-channel folded-gate transistor, wherein the source and drain regions 130 and 140 are for example of N-type conductivity, the conductivity types of the various regions may be reversed, so as to form a P-channel folded-gate transistor.

Moreover, the semiconductor substrate 200 may have an N-type conductivity.

In addition, the trench may have different shapes.

In the above-described folded-gate transistor the gate is formed of polycrystalline silicon. However, other known gate technologies may be used. For example, the whole gate may be of a metal material instead of polycrystalline silicon.

Likewise, the steps of the above-described embodiment for forming the trench gate may be modified, for example by omitting the formation of the silicon nitride layer 205 and the silicon oxide layer 206.

Moreover, it is not necessary to use the epitaxial layer 201 to form the semiconductor layer. Also, it is possible to use other means to form the drain and source regions, e.g. by means of an epitaxial growth.

In addition, one can modify the profiles of the dopant concentrations.

Indeed, further means for growing the oxide layers and the silicon nitride may be employed.

In addition, it is also possible to manufacture a folded-gate MOS transistor easily in a structure including the typical MOS transistor, having the channel region developing horizontally between the drain and source regions.

The transistor 100 may partially or fully compose an Integrated Circuit, which may be incorporated in an electronic system such as in the ignition system of an automobile.

From the foregoing it will be appreciated that, although specific embodiments of the invention have been described herein for purposes of illustration, various modifications may be made without deviating from the spirit and scope of the invention.

What is claimed is:

1. An insulated-gate transistor including:
   a semiconductor layer of a first conductivity type,
   an insulated gate comprising a trench gate extending into the semiconductor layer,
   a source and a drain regions of a second conductivity type formed in the semiconductor layer at respective sides of the trench gate,
   wherein
   each one of the source and drain regions includes:
   a first doped region having a depth ranging from approximately 2.5 μm to approximately 3 μm, having a first dopant concentration ranging from approximately $1*10^{15}$ ions/cm$^3$ to approximately $1*10^{17}$ ions/cm$^3$, formed in the semiconductor layer adjacent to the trench gate, said first dopant concentration being such that a breakdown voltage of the junction formed by the first doped region and the semiconductor layer is higher than a predetermined breakdown voltage, and
   a second doped region, having a second dopant concentration higher than the first dopant concentration ranging from approximately $1*10^{17}$ ions/cm$^3$ to approximately $1*10^{19}$ ions/cm$^3$, said second doped region being formed in the first doped region and being spaced apart from the trench gate, the second dopant concentration being adapted to form a non-rectifying contact for electrically contacting the first doped region.

2. The insulated-gate transistor according to claim 1, wherein the second doped regions are spaced apart from the trench gate of a distance ranging from approximately 0.3 μm to approximately 2 μm.

3. The insulated-gate transistor according to claim 1, wherein a dopant concentration of the first doped regions gradually varies towards a junction with the semiconductor layer, the first doped regions and the semiconductor layer forming a graded PN junctions.

4. The insulated-gate transistor according to claim 1, wherein the drain and source regions are structurally equal to each other so as to be functionally interchangeable.

5. A transistor, comprising:
   a substrate;
   a body region disposed in the substrate, having a first conductivity, and having a substantially uniform first dopant concentration;
   a trench disposed in the substrate and having a bottom and a side, the bottom and a portion of the sidewall being contiguous with the body region;
   an insulator disposed over the side wall and bottom of the trench;
   a gate electrode disposed in the trench;
   a first drain/source region disposed in the substrate, adjacent to a first portion of the trench side wall and contiguous with the body region, and having a second doping concentration;
   a second drain/source region disposed in the substrate, separate from the first drain/source region, adjacent to a second portion of the trench side wall and contiguous with the body region, and having a third doping concentration;

a first contact region disposed in the first drain/source region and having a fourth doping concentration that is higher than the second doping concentration; and a second contact region disposed in the second drain/source region and having a fifth doping concentration that is higher than the third doping concentration that is different from the second doping concentration.

6. The transistor of claim 5 wherein the bottom of the trench is deeper in the substrate than the first and second source/drain regions.

7. The transistor of claim 5 wherein the first and second source/drain regions are respectively contiguous with the first and second portions of the trench side wall.

8. The transistor of claim 5 wherein:
the substrate has a p-type conductivity; and
the first and second source/drain regions and the first and second contact regions have an n-type conductivity.

9. The transistor of claim 5 wherein:
the substrate has an n-type conductivity; and
the first and second source/drain regions and the first and second contact regions have a p-type conductivity.

10. The transistor of claim 5 wherein the first and second contact regions are each spaced approximately the same distance from the trench side wall.

11. The transistor of claim 5, wherein the substrate comprises:
a base layer; and
an epitaxial layer disposed on the base layer.

12. The transistor of claim 5 wherein:
the substrate comprises,
a base layer, and
an epitaxial layer disposed on the base layer; and
the trench is disposed entirely within the epitaxial layer.

13. The transistor of claim 5, further comprising a body region disposed in the substrate and contiguous with a third portion of the trench side wall.

14. The transistor of claim 5, further comprising a body region disposed in the substrate and contiguous with the trench bottom.

15. The transistor of claim 5, further comprising:
a body region disposed in the substrate and contiguous with the trench bottom and a third portion of the trench side wall that is contiguous with the trench bottom; and
wherein the first and second portions of the trench side wall are contiguous with the third portion of the trench side wall.

16. The transistor of claim 5, further comprising:
a gate contact disposed over the gate electrode;
a first source/drain contact disposed over the first contact region; and
a second source/drain contact disposed over the second contact region.

17. The transistor of claim 5 wherein the substrate comprises a semiconductor material.

18. An integrated circuit, comprising:
a substrate; and
a transistor comprising,
a body region disposed in the substrate, having a first conductivity, and having a substantially uniform first dopant concentration;
a trench disposed in the substrate and having a bottom and a side wall, the bottom and a portion of the sidewall being contiguous with the body region;
an insulator disposed over the side wall and bottom of the trench;
a gate electrode disposed in the trench,
a first drain/source region disposed in the substrate, adjacent to a first portion of the trench side wall and contiguous with the body region, and having a second do in concentration that is different from the second doping concentration;
a second drain/source region disposed in the substrate, separate from the first drain/source region, adjacent to a second portion of the trench side wall and contiguous with the body region, and having a third doping concentration;
a first contact region disposed in the first drain/source region and having a fourth doping concentration that is higher than the second doping concentration; and
a second contact region disposed in the second drain/source region and having a fifth doping concentration that is higher than the third doping concentration.

19. An electronic system, comprising:
an integrated circuit comprising:
a substrate, and
a transistor comprising,
a body region disposed in the substrate, having a first conductivity, and having a substantially uniform first dopant concentration;
a trench disposed in the substrate and having a bottom and a side wall, the bottom and a portion of the sidewall being contiguous with the body region;
an insulator disposed over the side wall and bottom of the trench;
a gate electrode disposed in the trench,
a first drain/source region disposed in the substrate, adjacent to a first portion of the trench side wall and contiguous with the body region, and having a second doping concentration;
a second drain/source region disposed in the substrate, separate from the first drain/source region, adjacent to a second portion of the trench side wall and contiguous with the body region, and having a third do in concentration that is different from the second doping concentration;
a first contact region disposed in the first drain/source region and having a fourth doping concentration that is higher than the second doping concentration; and
a second contact region disposed in the second drain/source region and having a fifth doping concentration that is higher than the third doping concentration.

20. A transistor, comprising:
a substrate;
a trench disposed in the substrate and having a side wall and a bottom, the trench having a depth ranging from approximately 2 μm to approximately 10 μm;
an insulator disposed over the side wall and bottom of the trench;
a gate electrode disposed in the trench;
a first drain/source region disposed in the substrate, adjacent to a first portion of the trench side wall, and having a first doping concentration;
a second drain/source region disposed in the substrate, separate from the first drain/source region, adjacent to a second portion of the trench side wall, and having a second doping concentration that is different from the first doping concentration;

a first contact region disposed in the first drain/source region and having a third doping concentration that is higher than the first doping concentration; and a second contact region disposed in the second drain/source region and having a fourth doping concentration that is higher than the second doping concentration.

21. A transistor, comprising:

a substrate;

a trench disposed in the substrate and having a side wall and a bottom;

an insulator disposed over the side wall and bottom of the trench;

a gate electrode disposed in the trench;

a first drain/source region disposed in the substrate, adjacent to a first portion of the trench side wall, and having a first doping concentration;

a second drain/source region disposed in the substrate, separate from the first drain/source region, adjacent to a second portion of the trench side wall, and having a second doping concentration that is different from the first doping concentration such that a breakdown voltage formed between the first and second drain source regions is approximately 50 volts;

a first contact region disposed in the first drain/source region and having a third doping concentration that is higher than the first doping concentration; and a second contact region disposed in the second drain/source region and having a fourth doping concentration that is higher than the second doping concentration.

* * * * *

UNITED STATES PATENT AND TRADEMARK OFFICE
CERTIFICATE OF CORRECTION

PATENT NO. : 7,629,645 B2  Page 1 of 1
APPLICATION NO. : 11/482531
DATED : December 8, 2009
INVENTOR(S) : Montanini et al.

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 400 days.

Signed and Sealed this

Twenty-first Day of December, 2010

David J. Kappos
*Director of the United States Patent and Trademark Office*